United States Patent
Iwashita et al.

[11] Patent Number: 6,139,022
[45] Date of Patent: Oct. 31, 2000

[54] PISTON RING

[75] Inventors: Takatsugu Iwashita, Matsumoto; Nobuyuki Yamashita, Shiojiri, both of Japan

[73] Assignee: Teikoku Piston Ring Co., Ltd., Tokyo, Japan

[21] Appl. No.: 09/161,486

[22] Filed: Sep. 28, 1998

[30] Foreign Application Priority Data

Sep. 30, 1997 [JP] Japan ................................. 9-282862
Jul. 13, 1998 [JP] Japan ................................. 10-213526

[51] Int. Cl.⁷ ........................................................ F16J 9/26
[52] U.S. Cl. ........................... 277/443; 277/442; 277/444; 277/938
[58] Field of Search .................................. 277/310, 442, 277/443, 444, 534, 538, 938

[56] References Cited

U.S. PATENT DOCUMENTS

| | | |
|---|---|---|
| 3,731,941 | 5/1973 | Mori et al. |
| 4,974,498 | 12/1990 | Lemelson. |
| 5,582,414 | 12/1996 | Miyazaki et al. ............... 277/444 |
| 5,601,293 | 2/1997 | Fukutome et al. ............... 277/443 |
| 5,743,536 | 4/1998 | Komuro et al. ................. 277/440 |
| 5,820,131 | 10/1998 | Tanaka et al. .................. 277/442 |
| 5,960,762 | 10/1999 | Imai ........................... 277/440 X |

FOREIGN PATENT DOCUMENTS 41 15 612  11/1992  Germany.
5-54594    3/1987   Japan.
3-260362   11/1991  Japan.
5-179451   7/1993   Japan.
8-184375   7/1996   Japan.

OTHER PUBLICATIONS

Patent Abstracts of Japan, Shigeru, "Combination of Piston Rings", Publication No. JP 55069744, published May 26, 1980.

*Primary Examiner*—Anthony Knight
*Assistant Examiner*—Karlena D. Schwing
*Attorney, Agent, or Firm*—Armstrong, Westerman, Hattori, McLeland & Naughton

[57] ABSTRACT

A piston ring is formed over the entire surface with a gas nitrided layer and a hard film with a thickness of 0.5 to 10 micrometers on the gas nitrided layer at the outer circumferential surface. The hard film comprises diamond-like carbon in which are dispersed carbides of one or more elements selected from the group consisting of silicon, titanium, tungsten, chromium, molybdenum, niobium, and vanadium. The diamond-like carbon is configured with any one of an amorphous carbon structure, an amorphous carbon structure having partly a diamond structure, or an amorphous carbon structure having partly a graphite structure. The content of the above elements is 5 to 40 atomic percent, and the hard film has a Vicker's hardness in a range from 700 to 2,000. A chromium plating film or ion plating film may be used instead of the gas nitrided layer. The hard film may be formed directly on the outer circumferential surface of the piston ring in a thickness from 10 to 30 micrometers

5 Claims, 6 Drawing Sheets

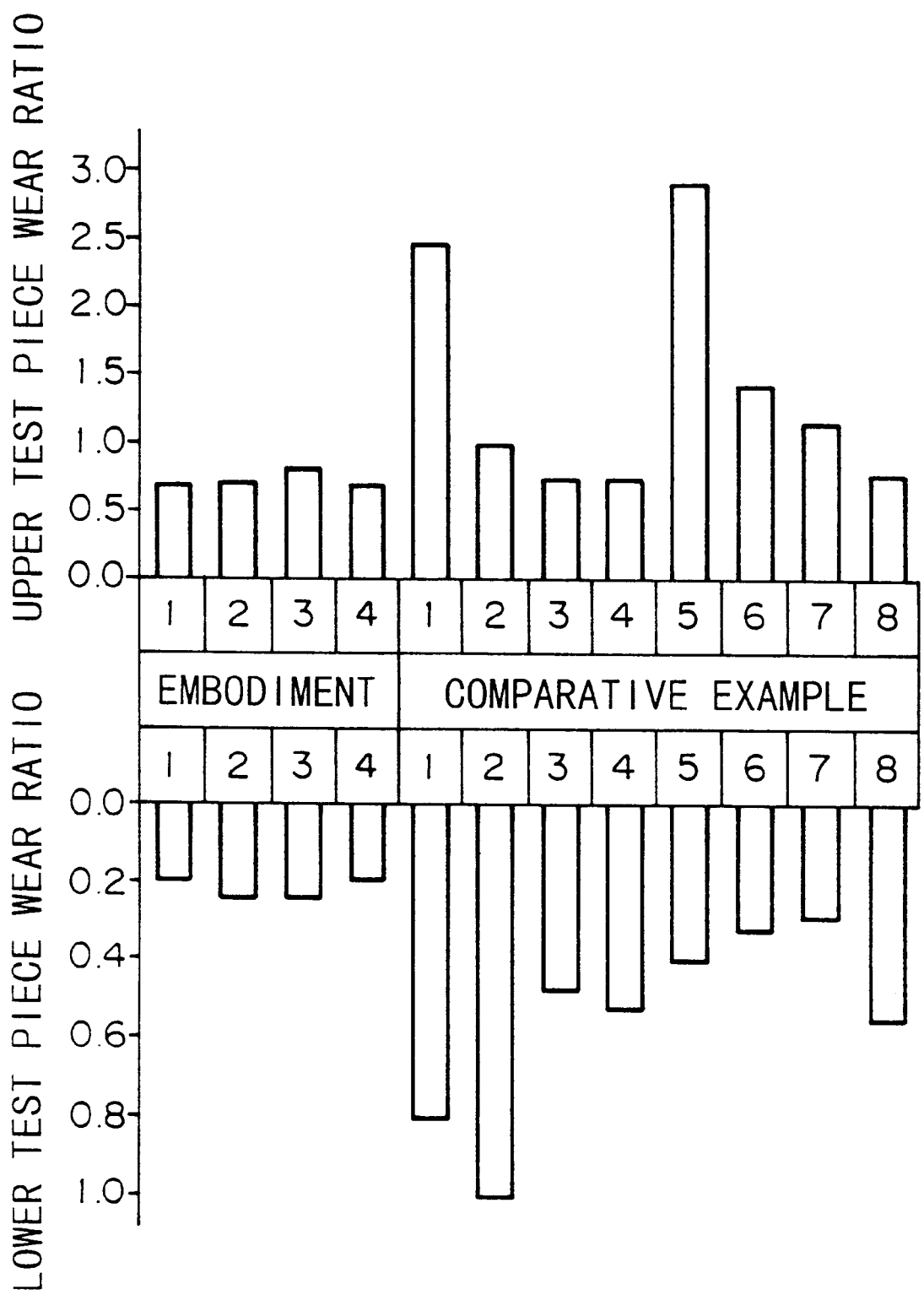

FIG. 5

| LOAD kg | 6 | 8 | 10 | 12 | 14 | 16 |
|---|---|---|---|---|---|---|
| EMBODIMENT 1 | ○ | ○ | ○ | ○ | ○ | ○ |
| EMBODIMENT 2 | ○ | ○ | ○ | ○ | ○ | ○ |
| EMBODIMENT 3 | ○ | ○ | ○ | ○ | ○ | ○ |
| EMBODIMENT 4 | ○ | ○ | ○ | ○ | ○ | ○ |
| COMPARATIVE EXAMPLE 1 | ○ | ○ | × | × | × | × |
| COMPARATIVE EXAMPLE 2 | × | × | × | × | × | × |
| COMPARATIVE EXAMPLE 3 | ○ | ○ | ○ | ○ | × | × |
| COMPARATIVE EXAMPLE 4 | ○ | ○ | ○ | ○ | × | × |
| COMPARATIVE EXAMPLE 5 | ○ | ○ | ○ | ○ | × | × |
| COMPARATIVE EXAMPLE 6 | ○ | ○ | ○ | ○ | × | × |
| COMPARATIVE EXAMPLE 7 | ○ | ○ | ○ | ○ | × | × |
| COMPARATIVE EXAMPLE 8 | ○ | ○ | ○ | ○ | × | × |

○ : NO SCUFFING
× : SCUFFING

PISTON RING

BACKGROUND OF THE INVENTION

1. Technical Field of the Invention

The present invention relates to a piston ring for use in internal combustion engines.

2. Description of the Related Art

Engines in recent years must meet increased demands for higher output, high revolutions per minute and longer product service life, and must also comply with ever stricter exhaust gas emission regulations. The piston ring must therefore function in a harsher operating environment. Cylinders in such engines are conventionally made out of cast iron and the external circumference of the piston ring has a wear resistant surface treatment layer.

The wear resistant surface treatment layer on the external circumferential surface of the piston ring of the conventional art is a chromium plating film, nitrided layer, or ion plating film such as chromium nitride (CrN, $Cr_2N$) film or titanium nitride (TiN) film.

In the initial stage of engine operation, break-in between the cylinder and piston ring is not sufficient so that scuffing may occur between the cylinder and piston ring formed with the above mentioned wear resistant surface treatment layer. Accordingly, a method to improve initial break-in characteristics of these wear resistant surface treatment layers or a wear resistant surface treatment layer having both scuffing resistance and wear resistance is needed.

To respond to the above problem, the following arts have been proposed.

1. Japanese Patent Laid-open No. 8-184375

A film of either 98.0 to 99.5 percent molybdenum or chromium or both and the remainder of nitrogen was formed by physical vapor deposition on a nitrided layer or physical vapor deposition film in order to improve the initial break-in characteristics.

2. Japanese Patent Publication No. 5-54594

A TiN film was formed over a hard film comprised of CBN, TiC, Ti (C,N), SiC, diamonds or $Al_2O_3$ in order to improve the scuffing resistance.

On the other hand, the following art involved coating of artificial diamond material has been proposed.

3. Japanese Patent Laid-open No. 3-260362

A thin film of artificial diamond material was formed on the piston ring and on the top surface, external circumferential surface and ring groove of the piston in order to improve durability.

Further, the following art involved use of a diamond-like carbon film has been proposed.

4. Japanese Patent Laid-open No. 5-179451

In order to restrict the adhesion of ferrite structures, a film having amorphous carbon as the main constituent in which tungsten and/or silicon was dispersed was formed on the sliding surface which mates with a sliding surface formed of iron-type material containing ferrite. This technology is utilized for instance, in the hydraulic valve in power steering mechanisms.

However, under harsh engine operating conditions, the technology proposed in the above first method has the drawback that the molybdenum or chromium film wears away quickly. The technology proposed in the above second method has a TiN film with excessive hardness so that resistance to scuffing is inadequate. The technology proposed in the above third method has no detailed description of any kind regarding the thin film of artificial diamond material. The technology proposed in the above fourth method describes amorphous carbon in which tungsten or silicon is dispersed, yet provides no description of tungsten carbides or silicon carbides.

SUMMARY OF THE INVENTION

It is an object of the present invention to provide a piston ring having both resistance to scuffing and resistance to wear.

In a piston ring of the present invention formed with a hard film on the outer circumferential surface, the hard film is characterized by comprising diamond-like carbon in which are dispersed carbides of one or more elements selected from the group consisting of silicon, titanium, tungsten, chromium, molybdenum, niobium, and vanadium.

The diamond-like carbon forming a film of the present invention is configured from any one of the following structures.

1. Amorphous carbon structure
2. Amorphous carbon structure having partly a diamond structure.
3. Amorphous carbon structure having partly a graphite structure.

The hard film of the present invention may be dispersed with non-carbonized metal in minute amounts provided that the effect of the invention is not lost.

The scuffing resistance of the diamond-like carbon film is inherently high, however a film having both scuffing resistance and wear resistance can be obtained by including carbides of one or more elements selected from the group consisting of silicon, titanium, tungsten, chromium, molybdenum, niobium, and vanadium. This film also has superior initial break-in characteristics.

The silicon, titanium, tungsten, chromium, molybdenum, niobium, and vanadium content can be measured with an electron probe microanalyzer. The total atomic ratio of the above elements is preferably 5 to 40 percent and preferably the hard film has a Vicker's hardness within a range of 700 to 2000. When the total atomic ratio falls below 5 percent, the hardness, scuffing resistance and wear resistance decline. When the total atomic ratio is above 40 percent, a drop in scuffing resistance and adhesion occurs. When the Vicker's hardness of the hard film is below 700, the wear resistance declines. When the Vicker's hardness is above 2,000, a drop in scuffing resistance and cracks on the film are prone to occur. More preferably, the total atomic ratio is 10 to 30 percent and a Vicker's hardness for the hard film is within a range of 900 to 1200.

BRIEF DESCRIPTION OF THE DRAWINGS

FIGS. 1(a) and 1(b) are samples in which a hard film is formed on a wear resistant surface treatment layer of a different type. FIG. 1(c) is a sample in which a hard film is applied without forming a wear resistant surface treatment layer of a different type.

FIG. 3 a graph showing test results from the wear tests.

FIG. 4(a) is a front view partly in cross section. FIG. 4(b) is a side view.

FIG. 5 is a table showing test results from the scuffing tests.

DESCRIPTION OF THE PREFERRED EMBODIMENTS

Hereafter, the preferred embodiments of the present invention will be described while referring to FIG. 1(*a*) to FIG. 1(*c*).

Figure 1A:
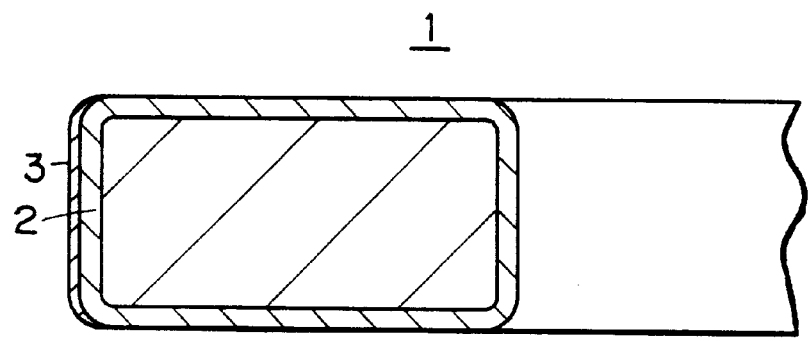
FIGS. 1(a), 1(b) and 1(c) are respectively longitudinal cross sectional views of a portion of the piston rings illustrating embodiments of the present invention.
Figure 1B:
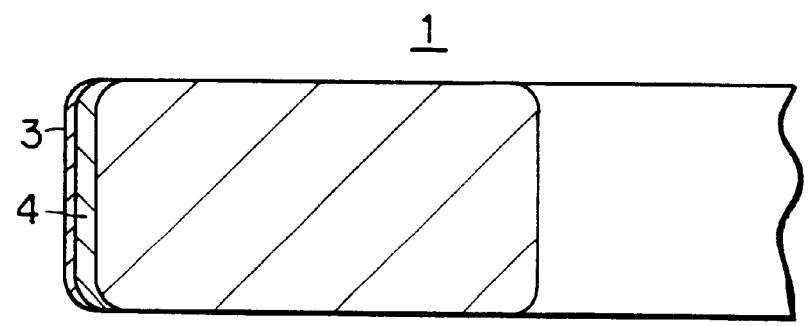
Figure 1C:
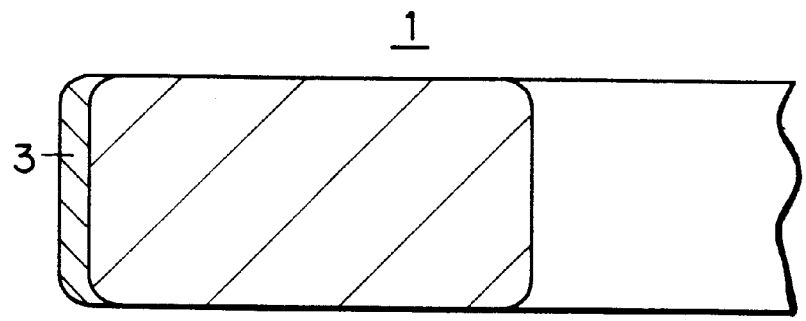

In FIG. 1(*a*), a gas nitrided layer 2 with a thickness of 5 to 15 micrometers is formed on the entire surface of a piston ring 1. A hard film 3 with a thickness of 0.5 to 10 micrometers is formed over the gas nitrided layer 2 at the outer circumferential surface. The hard film 3 comprises diamond-like carbon in which are dispersed carbides of one or more elements selected from the group consisting of silicon, titanium, tungsten, chromium, molybdenum, niobium, and vanadium. The total atomic ratio of one or more elements selected from the group consisting of silicon, titanium, tungsten, chromium, molybdenum, niobium, and vanadium is 5 to 40 percent and the hard film 3 has a Vicker's hardness within a range of 700 to 2000.

Another example is shown in FIG. 1(*b*). A chromium plating film, or ion plating film 4 such as chromium nitride (CrN, $Cr_2N$) film or titanium nitride (TiN) film is formed on the outer circumferential surface of the piston ring 1. The hard film 3 is formed in a thickness of 0.5 to 10 micrometers over the film 4. When chromium plating film is used, the chromium plating film thickness is 5 to 150 micrometers, and when ion plating film is used, the ion plating film thickness is 1 to 150 micrometers.

FIG. 1(*c*) shows an example of the hard film 3 directly formed in a thickness of 10 to 30 micrometers on the outer circumferential surface of the piston ring 1 without forming a wear resistant surface treatment layer (gas nitrided layer 2, or chromium plating film or ion plating film 4) which is different in type from the hard film 3. When the film thickness is lower than 10 micrometers, the wear resistance is inadequate and when above 30 micrometers, the adhesion declines and cracks are prone to occur in the film.

The hard film 3 can be coated by using the reactive ion plating method or reactive sputtering method. For instance, the hard film 3 is coated onto the substrate by the reactive ion plating method as related below. That is, an inert gas is introduced into a vacuum chamber while the substrate is rotated. After cleaning the substrate surface by ion bombardment, a hydrocarbon gas such as methane which is a source of carbon is introduced into the chamber and while the vicinity of the substrate is maintained in a plasma state, one or more elements selected from the group consisting of silicon, titanium, tungsten, chromium, molybdenum, niobium, and vanadium are vaporized. In such cases, by adjusting the partial pressure of hydrocarbon gas in the reactive gas, the one or more atoms selected from the group consisting of silicon, titanium, tungsten, chromium, molybdenum, niobium, and vanadium can be deposited as a carbide. The ratio of the respective contents of the one or more elements selected from the group consisting of silicon, titanium, tungsten, chromium, molybdenum, niobium, and vanadium can be controled by adjusting the pressure of the reactive gas as well as the evaporation speed of these elements.

Hereafter, the superior scuffing resistance and wear resistance of the piston ring of the present invention will be demonstrated by showing results of wear measurements by means of the reciprocating friction testing machine and results of measurements of scuffing load by means of the pin-on-cylinder friction testing machine.

1. Wear Test
(1) Reciprocating Friction Testing Machine

Figure 2:
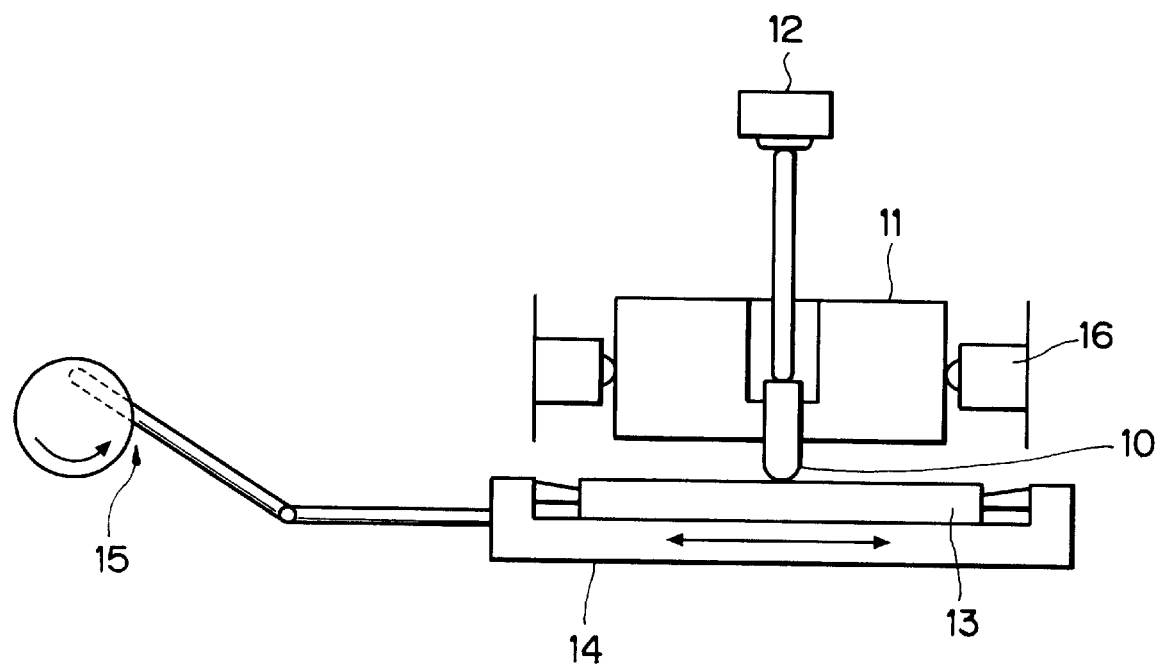
FIG. 2 is a drawing showing a configuration of the reciprocating friction testing machine.

The structure of the reciprocating friction testing machine used in the test is shown in FIG. 2. A pin shaped upper test piece 10 is supported by a fixed block 11 and is pressed against a lower test piece 13 by a downward load which is applied by a hydraulic cylinder 12. The flat-shaped lower test piece 13 on the other hand, is supported by a movable block 14 and moved forwards and backwards by a crank mechanism 15. A load cell is denoted by the reference numeral 16.

(2) Test Conditions

Load: 10 kilograms

Speed: 600 c.p.m.

Time: 60 minutes

Lubricating oil: 10 W engine oil (3) Test Piece

Upper test piece: Steel for piston ring Film is formed as shown in Table 1 and Table 2.

Lower test piece: Flake graphite cast iron for cylinder liner 17×17×70 (mm)

(4) Hard Film Forming Method

The hard film was formed by the reactive ion plating method as related previously. The temperature of the substrate was in a range between 200 to 500° C.

(5) Test Results

Test results are shown in FIG. 3. The wear amount of a comparative example 2 is set as 1. The amount of wear of the hard film of the present invention is equivalent to or less than the amount of wear of the TiN and CrN ion plating films of the conventional art known to have excellent resistance to wear. A special feature of the present invention is that the amount of wear of the mating material (cast iron) is small. Further, the hard film comprised of diamond-like carbon demonstrated improved resistance to wear on account of a tungsten carbide or silicon carbide content in specific amounts.

2. Scuffing Test
(1) Pin-on-cylinder Friction Testing Machine

Figure 4A:
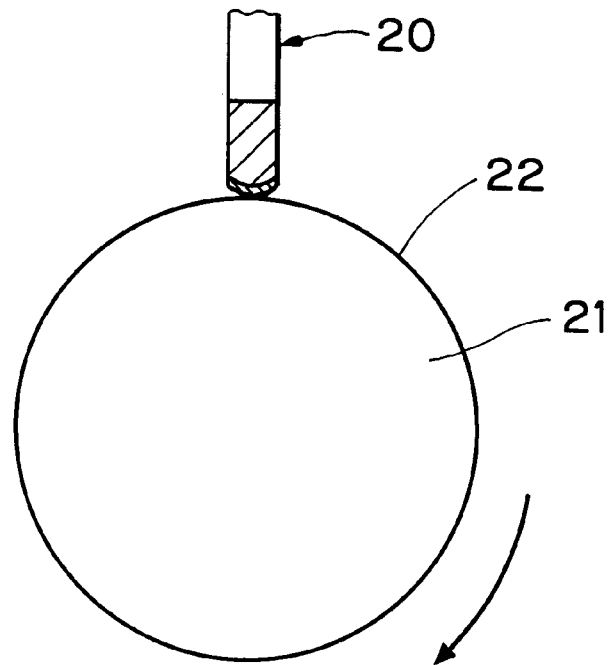
FIGS. 4(a) and 4(b) are drawings showing the structure of the pin-on-cylinder friction testing machine.
Figure 4B:
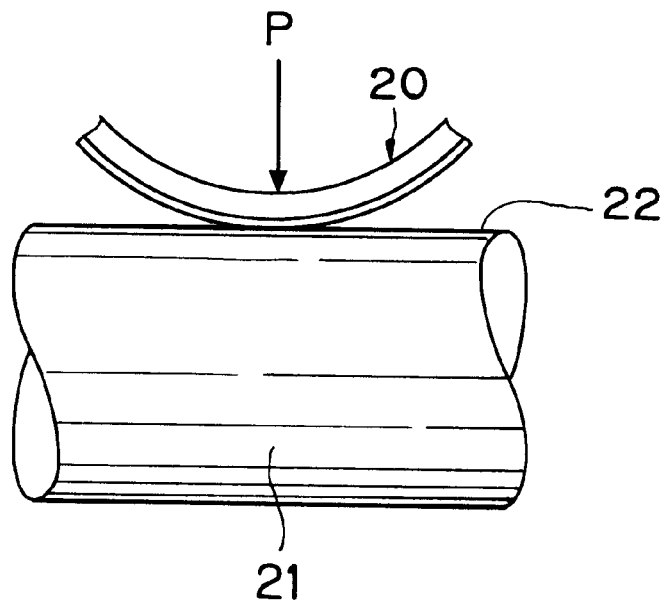

The structure of the pin-on-cylinder friction testing machine used in the scuffing test is shown in FIGS. 4(*a*) and 4(*b*). A test piece 20 as the piston ring is mounted on the upper end of the outer circumferential surface 22 of a rotor 21 rotated around the horizontal axis. A load P is applied to the test piece 20 which is the piston ring, pressing the piston ring against the outer circumferential surface of the rotor 21. The rotor 21 is rotated in this state, while supplying lubricating oil to the contact portion between the rotor 21 and the test piece 20 as the piston ring. The test piece was observed for the presence or absence of scuffing on the sliding surface after the testing machine was operated for specified times at different types of loads.

(2) Test Conditions

Rotation speed: 1000 r.p.m.

Load: 6–16 kilograms

Time: The testing machine was operated for 60 seconds at the specified load and the sliding surface was monitored for the presence or absence of scuffing. The scuffing test was repeated with increasing loads.

Lubricating oil: Dropping of 10 W lubricating oil (3) Test Piece

The films shown in Table 1 and Table 2 were formed on the outer circumferential surface of the piston ring.

(4) Rotor 21

Flake graphite cast iron for cylinder liner φ50 mm×300 mm (5) Test Results

As shown in FIG. 5, the scuffing limit loads of the hard films of the present invention were demonstrated to be higher than the scuffing limit loads of the TiN and CrN films of the conventional art known to have excellent resistance to wear. Further, the hard film comprised of diamond-like carbon demonstrated improved scuffing resistance on account of a tungsten carbide or silicon carbide content in specific amounts.

TABLE 1

| No. | Under layer | Structure of hard film on sliding surface | Thickness of hard film on sliding surface μm | Vicker's hardness of hard film on sliding surface |
|---|---|---|---|---|
| Embodiment | | | | |
| 1 | Gas nitrided layer | Amorphous carbon and tungsten carbide (W: 14 atomic percent) | 5 | 1300 |
| 2 | Gas nitrided layer | Amorphous carbon and silicon carbide (Si: 30 atomic percent) | 5 | 1800 |
| 3 | Gas nitrided layer | Amorphous carbon and silicon carbide (Si: 7 atomic percent) | 5 | 1000 |
| 4 | Chromium plating film 100 μm | Amorphous carbon and tungsten carbide (W: 14 atomic percent) | 5 | 1300 |
| Comparative example | | | | |
| 1 | None | Chromium plating film | 60 | 800 |
| 2 | None | Gas nitrided layer | 60 | 1000 |
| 3 | Gas nitrided layer | CrN ion plating film | 30 | 1600 |

TABLE 2

| No. | Under layer | Structure of hard film on sliding surface | Thickness of hard film on sliding surface μm | Vicker's hardness of hard film on sliding surface |
|---|---|---|---|---|
| Comparative example | | | | |
| 4 | Gas nitrided layer | TiN ion plating film | 10 | 2000 |
| 5 | Gas nitrided layer | Cr ion plating fim | 5 | 750 |
| 6 | Gas nitrided layer | Amorphous carbon | 5 | 500 |
| 7 | Gas nitrided layer | Amorphous carbon and silicon carbide (Si: 4 atomic percent) | 5 | 650 |
| 8 | Gas nitrided layer | Amorphous carbon and silicon carbide (Si: 42 atomic percent) | 5 | 2100 |

The structures of the hard films of the embodiments 1 through 4 and the comparative examples 6 through 8 were analyzed by X-ray diffraction of each test piece. The X-ray tube was a copper tube and a monochromator was used. The tube voltage was 40 kilovolts. The tube current was 30 milliamperes. An X-ray diffraction pattern of the embodiment 4 is shown in FIG. 6.

Figure 6:
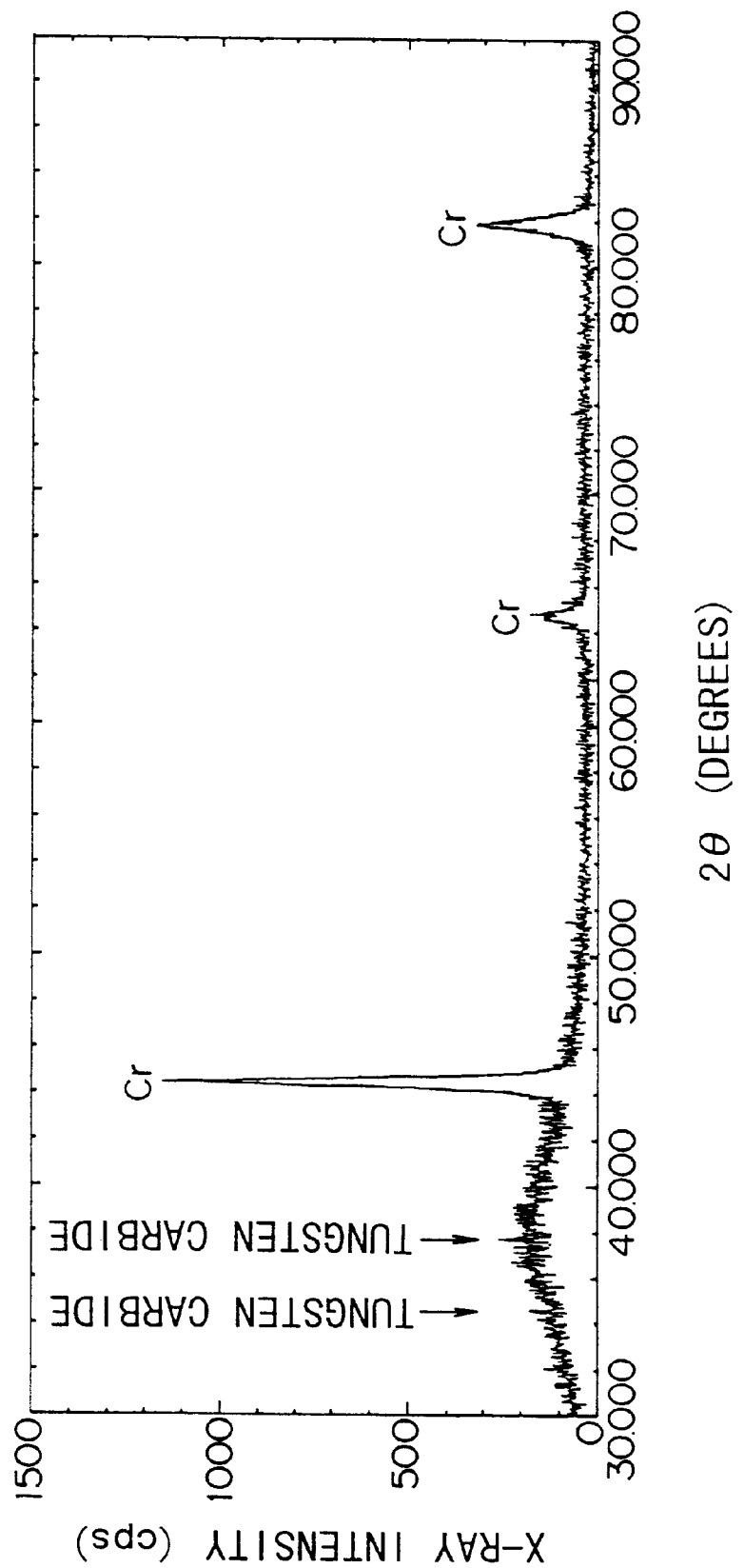
FIG. 6 is an X-ray diffraction pattern of the film of embodiment 4.

FIG. 6 shows the following matters.

1. A halo is present in $2\theta=34°$ to $42°$, which shows that film has amorphous structure.
2. The diffraction peak in the vicinity of $2\theta=44.5°$, $65°$ and $82°$ is the diffraction ray from the chromium plating film of the under layer.
3. The diffraction peak for the tungsten carbide which can be identified as $W_2C$ or $W_6C_{2.54}$ is present in the vicinity of $2\theta=34.5°$ and $38°$.
4. There is no diffraction peak for metallic tungsten in the vicinity of $2\theta=40°$, $58°$ and $73°$.

It can be seen from the above items that the film of the embodiment 4 has a structure comprised of amorphous carbon and tungsten carbide.

The hard film in this test was comprised of diamond-like carbon as the main constituent and tungsten carbide or silicon carbide, however the same effect can be obtained with a hard film comprising diamond-like carbon in which are dispersed carbides of one or more elements selected from the group consisting of silicon, titanium, tungsten, chromium, molybdenum, niobium, and vanadium.

Although the present invention has been described with reference to the preferred embodiments, it is apparent that the present invention is not limited to the aforesaid preferred embodiments, but various modifications can be attained without departing from its scope.

What is claimed is:

1. A piston ring having a hard film on the outer circumferential surface of said piston ring, wherein said hard film comprises diamond-like carbon in which are dispersed carbides of one or more elements selected from the group consisting of silicon, titanium, tungsten, chromium, molybdenum, niobium, and vanadium.

2. A piston ring as claimed in claim 1, wherein content of said one or more elements selected from the group consisting of silicon, titanium, tungsten, chromium, molybdenum, niobium, and vanadium is 5 to 40 atomic percent, and a Vicker's hardness of said hard film is within a range of 700 to 2000.

3. A piston ring as claimed in claim 2, wherein said hard film has a thickness of 0.5 to 10 micrometers and said hard film is formed on a wear resistant surface treatment layer of a different type.

4. A piston ring as claimed in claim 3, wherein said wear resistant surface treatment layer of a different-type is comprised of a chromium plating film, nitrided layer or ion plating film.

5. A piston ring as claimed in claim 2, wherein said hard film has a thickness of 10 to 30 micrometers and said hard film is formed directly on the outer circumferential surface of said piston ring.

* * * * *